US010785400B2

(12) United States Patent
Dutton et al.

(10) Patent No.: US 10,785,400 B2
(45) Date of Patent: Sep. 22, 2020

(54) MULTIPLE FIELDS OF VIEW TIME OF FLIGHT SENSOR

(71) Applicant: STMICROELECTRONICS (RESEARCH & DEVELOPMENT) LIMITED, Marlow (GB)

(72) Inventors: Neale Dutton, Edinburgh (GB); Stuart McLeod, Edinburgh (GB); Bruce Rae, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 390 days.

(21) Appl. No.: 15/728,213

(22) Filed: Oct. 9, 2017

(65) Prior Publication Data

US 2019/0109977 A1 Apr. 11, 2019

(51) Int. Cl.
| | |
|---|---|
| *G01C 3/08* | (2006.01) |
| *H04N 5/232* | (2006.01) |
| *H04N 5/247* | (2006.01) |
| *H04M 1/02* | (2006.01) |
| *G01S 7/4863* | (2020.01) |
| *G01S 17/89* | (2020.01) |
| *G01S 7/481* | (2006.01) |
| *H04N 5/345* | (2011.01) |
| *G01S 17/86* | (2020.01) |
| *H01S 5/183* | (2006.01) |

(52) U.S. Cl.
CPC ....... *H04N 5/23212* (2013.01); *G01S 7/4815* (2013.01); *G01S 7/4863* (2013.01); *G01S 17/86* (2020.01); *G01S 17/89* (2013.01); *H04M 1/0202* (2013.01); *H04N 5/247* (2013.01); *H04N 5/3454* (2013.01); *H01S 5/183* (2013.01); *H04M 2250/12* (2013.01); *H04N 5/232121* (2018.08)

(58) Field of Classification Search
None
See application file for complete search history.

(56) References Cited

U.S. PATENT DOCUMENTS

| | | | | |
|---|---|---|---|---|
| 5,870,635 A | * | 2/1999 | Shindo | G02B 7/346 348/298 |
| 6,167,206 A | * | 12/2000 | Hylen | G03B 1/48 396/316 |

(Continued)

FOREIGN PATENT DOCUMENTS

| | | |
|---|---|---|
| CN | 1512136 A | 7/2004 |
| CN | 1779802 A | 5/2006 |

(Continued)

*Primary Examiner* — Isam A Alsomiri
*Assistant Examiner* — Amir J Askarian
(74) *Attorney, Agent, or Firm* — Slater Matsil, LLP (57) ABSTRACT

In some embodiments, a ToF sensor includes an illumination source module, a transmitter lens module, a receiver lens module, and an integrated circuit that includes a ToF imaging array. The ToF imaging array includes a plurality of SPADs and a plurality of ToF channels coupled to the plurality of SPADs. In a first mode, the ToF imaging array is configured to select a first group of SPADs corresponding to a first FoV. In a second mode, the ToF imaging array is configured to select a second group of SPADs corresponding to a second FoV different than the first FoV.

34 Claims, 6 Drawing Sheets

(56) References Cited

U.S. PATENT DOCUMENTS

| | | | |
|---|---|---|---|
| 7,180,074 B1* | 2/2007 | Crosetto | G01T 1/1611 250/370.09 |
| 9,303,989 B2* | 4/2016 | Nehmadi | G01C 11/06 |
| 9,992,477 B2* | 6/2018 | Pacala | G02B 27/2214 |
| 10,091,440 B1* | 10/2018 | Murphy, Jr. | H04N 5/2254 |
| 10,514,256 B1* | 12/2019 | Kamarshi | G01C 3/08 |
| 2004/0125357 A1 | 7/2004 | Ohtomo et al. | |
| 2006/0077859 A1* | 4/2006 | Nishimoto | G11B 7/0903 369/112.1 |
| 2006/0209292 A1* | 9/2006 | Dowski, Jr. | G02B 3/0087 356/121 |
| 2006/0262324 A1* | 11/2006 | Hays | G01N 21/47 356/519 |
| 2007/0181810 A1 | 8/2007 | Tan et al. | |
| 2007/0182949 A1* | 8/2007 | Niclass | G01C 3/08 356/3 |
| 2009/0212219 A1* | 8/2009 | Cook | G01J 5/08 250/351 |
| 2010/0200763 A1* | 8/2010 | Thon | H01J 43/18 250/370.11 |
| 2011/0181855 A1* | 7/2011 | Bittner | G03F 7/70266 355/55 |
| 2011/0291988 A1* | 12/2011 | Bamji | G06F 3/0428 345/175 |
| 2012/0013760 A1* | 1/2012 | Parodi-Keravec | G01M 11/0264 348/222.1 |
| 2013/0188022 A1* | 7/2013 | Katz | G01S 17/87 348/47 |
| 2013/0208256 A1 | 8/2013 | Mamidipudi et al. | |
| 2013/0236183 A1* | 9/2013 | Chao | H05B 37/0272 398/101 |
| 2013/0278939 A1 | 10/2013 | Pfister et al. | |
| 2013/0314694 A1* | 11/2013 | Tchoryk, Jr. | G01S 17/95 356/28.5 |
| 2015/0029503 A1* | 1/2015 | McMackin | G01J 3/18 356/300 |
| 2015/0124241 A1 | 5/2015 | Eisele et al. | |
| 2016/0054447 A1* | 2/2016 | Sun | G01S 17/89 356/5.01 |
| 2016/0182891 A1* | 6/2016 | Ko | H04N 13/296 348/47 |
| 2016/0292514 A1* | 10/2016 | Robinson | G06K 9/6202 |
| 2017/0003379 A1 | 1/2017 | Downing et al. | |
| 2017/0176575 A1* | 6/2017 | Smits | G01S 17/10 |
| 2017/0257557 A1* | 9/2017 | Trusten | G06T 5/50 |
| 2017/0264880 A1* | 9/2017 | Zolotov | G06T 7/593 |
| 2018/0100929 A1* | 4/2018 | O'Keeffe | G01S 7/4815 |
| 2018/0113200 A1* | 4/2018 | Steinberg | G08G 1/04 |
| 2018/0191945 A1* | 7/2018 | Chen | H04N 5/2258 |
| 2018/0209846 A1* | 7/2018 | Mandai | G01S 17/89 |
| 2018/0217236 A1* | 8/2018 | Pacala | G01S 7/4816 |
| 2018/0300891 A1* | 10/2018 | Wang | H04N 5/225 |
| 2018/0321826 A1* | 11/2018 | Bereza | G06F 3/04815 |
| 2018/0329035 A1* | 11/2018 | Pacala | G02B 27/0955 |
| 2018/0329066 A1* | 11/2018 | Pacala | G01S 17/023 |
| 2018/0373944 A1* | 12/2018 | Sesti | G06K 9/00805 |
| 2019/0011541 A1* | 1/2019 | O'Keeffe | G01S 7/497 |
| 2019/0011556 A1* | 1/2019 | Pacala | G01S 7/4863 |
| 2019/0094981 A1* | 3/2019 | Bradski | G06F 3/013 |
| 2019/0317217 A1* | 10/2019 | Day | G06K 9/00791 |

FOREIGN PATENT DOCUMENTS

| | | |
|---|---|---|
| EP | 0488416 A1 | 11/1991 |
| WO | 9415184 A1 | 7/1994 |

* cited by examiner

MULTIPLE FIELDS OF VIEW TIME OF FLIGHT SENSOR

TECHNICAL FIELD

The present invention relates generally to a photonic device and, in particular embodiments, to a multiple fields of view time of flight sensor.

BACKGROUND

Photonic devices may be used in a variety of applications, such as, for example, mobile phones, cameras, and automotive applications. A number of applications take advantage of photonic systems using photonic sensors to determine a distance to an object. For example, a photonic ranging device application may use time of flight (ToF) to determine a distance between a reflective object and the device. In ToF systems, a pulse of light is emitted and reflected off an object back to a single photonic sensor. The time taken for the light to travel to the object and be reflected back onto the single photonic sensor may be used to determine the distance between the object and the device based on the known speed of light. Typically, the distance measured is to a single point. In other words, the light is emitted, reflected into the object, and then received by the single photonic sensor, and a single distance is reported. Light detection and ranging (LIDAR), also called LADAR, is an application that uses ToF techniques to detect the presence of objects and its associated distance from a source.

A proximity sensor may benefit from ToF techniques. Proximity sensors detect the presence of nearby objects without physical contact.

Another application that may benefit from ToF techniques is autofocus (AF) for cameras. There are two types of AF systems: passive AF systems and active AF systems. A passive AF system performs AF by analyzing the image captured by the image sensor. Phase detection AF (PDAF) is an example of a passive AF system. To perform AF, PDAF splits an image into two copies and then adjust the focus until both images are in phase (i.e., merge).

An active AF system determines the distance to the object to be focused on independently from the optical system and then controls the optical system to focus on such object. For example, an active AF system may measure the distance to an object by shining a laser or light emitting diode (LED) light, such as an edge-emitting laser or vertical cavity surface emitting laser (VCSEL), to the object and then using a single ToF sensor to determine the distance to the object and automatically focus the camera on the object. Relying on a ToF sensor for AF is typically faster than traditional ways of implementing AF, such as PDAF.

SUMMARY

In accordance with an embodiment, a ToF sensor includes an illumination source module, a transmitter lens module, a receiver lens module, and an integrated circuit that includes a ToF imaging array. The ToF imaging array includes a plurality of SPADs and a plurality of ToF channels coupled to the plurality of SPADs. In a first mode, the ToF imaging array is configured to select a first group of SPADs corresponding to a first FoV. In a second mode, the ToF imaging array is configured to select a second group of SPADs corresponding to a second FoV different than the first FoV.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a multiple fields of view time of flight (ToF) sensor implemented in a camera of a mobile phone and having autofocus (AF) assist. Embodiments of the present invention may also be implemented in point and shoot cameras and other types of cameras. Other embodiments may be implemented in proximity sensors, gesture recognition systems, automotive LIDAR, and other applications that may benefit from distance ranging and the generation of depth maps.

In an embodiment of the present invention, a ToF sensor having an array of photodetectors and a single fixed receiver (RX) lens is electronically configurable to have multiple fields of view (FoV). The ToF sensor may switch between different FoVs to match a FoV of a particular selected camera by turning off portions of the array of photodetectors. For example, in a dual camera system having a wide FoV camera and a narrow FoV camera, the full array of photodetectors of the ToF sensor is used when using the wide FoV camera while only a portion of the array of photodetectors of the ToF sensor is used when using the narrow FoV camera.

AF may be accomplished in a variety of ways. A depth map, for example, may be used for AF purposes. A depth map is a map (or matrix) of the distance between a three-dimensional scene and a viewpoint. The determination of the depth map may be accomplished, for example, with a ToF sensor. A depth map may be represented, for example, as a histogram of distances to objects in the scene. A particular scene may be partitioned into a plurality of portions, with each of the portions having respective distances or histograms of distances to respective objects in the respective portions. The depth map information, which may include a single histogram or a plurality of histograms, may be used to focus the camera on an object of the scene, or an object in a particular portion of the scene.

A depth map may be captured, for example, with a ToF sensor. A ToF sensor may include an array of photodetectors, such as an array of single photon avalanche diodes (SPADs), for detecting photons from objects in the scene. Each photodetector, with the aid of a controller in some cases, may produce a signal corresponding to a distance to an object using ToF techniques. The information from a plurality of photodetectors in the array of photodetectors may be used to generate the depth map. A receiver (RX) lens may be used to focus the received photons from the scene into the array of SPADs.

Figure 1A:
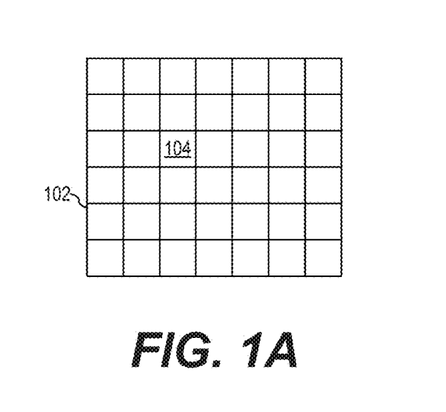
FIGS. 1a and 1b show a camera fields of view (FoV) and a corresponding ToF sensor FoV of an exemplary camera system, according to an embodiment of the present invention.
Figure 1B:
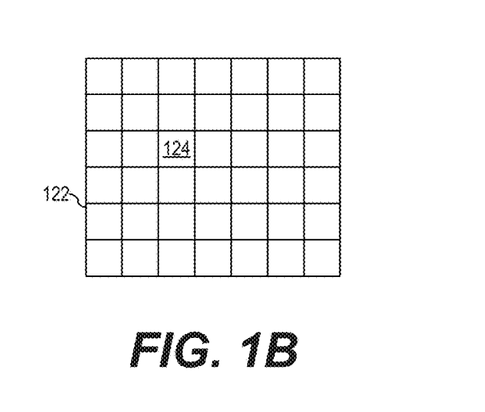

AF may be achieved without generating a full depth map. For example, in a single camera system, such as a mobile phone with a single camera, the ToF sensor may be placed next (e.g., adjacent) to the camera lens. The FoV of the ToF sensor may be designed so that it is equivalent to the FoV of the camera. In some embodiments, a user may use touch-to-focus. In other words, the user may select a portion of an image displaying on the screen of the mobile phone to focus on it. A ToF sensor may be used to determine the distance to objects in the selected portion of the image by using a multi-zone approach where photodetectors corresponding to the selected zone are used to detect the distance to objects in the selected zone. For example, FIG. 1a shows camera FoV 102 and FIG. 1b shows a corresponding ToF sensor FoV 122 of an exemplary camera system, according to an embodiment of the present invention. Camera FoV 102 is illustratively divided into 42 zones/portions arranged in an array of 6 rows and 7 columns. ToF sensor FoV 122 is similarly arranged. For example, a SPAD may be associated with each of the zones, resulting in a ToF sensor having 42 SPADs. ToF sensor FoV 122 is equivalent to camera FoV 102. When a user selects image area portion 104 to focus on it, the photodetector 124, which in some embodiments may include a plurality of photodetectors, may be used to determine the distance to objects in such corresponding portion and then provide such information to the AF module (autofocus module). The AF module may then control the lens driver to automatically focus on such objects.

In some embodiments, a user may use touch-to-focus for selecting a portion of an image displaying on the screen of the mobile phone to focus on it. In other embodiments, software may be used to automatically select a region of interest to focus on it. For example, a camera focus may determine an object of interest based on image recognition and select the region containing such object to focus on it. Other embodiments may use a combination of touch-to-focus and using software to automatically focus on a particular portion of the screen.

It is noted that a 6×7 array with 42 zones is simply one example and other size arrays could alternatively be used.

In some camera systems, such as stereo cameras or dual camera systems, two cameras may be used. In some dual camera systems, such as a dual camera system in a mobile phone, a first lens may have a wide FoV and a second lens may have a narrow FoV. The second lens may have, for example, 2× optical zoom while the first lens may have 1× optical zoom (i.e., no zoom). All else being equal, a camera with a wide FoV covers a larger area than a camera with a narrow FoV, and a camera with a narrow FoV has a higher photon rate than a camera with a wide FoV.

Because of the different FoVs of each of the cameras of the dual camera system, it may be difficult to achieve AF with a single ToF sensor. In other words, AF may be difficult to implement in a dual camera system having a camera with a wide FoV and a camera with a narrow FoV with a single ToF sensor because the field of view of the single ToF sensor may be different than the FoV of at least one of the cameras. For example, FIGS. 2a and 2b show wide FoV 204 of a first lens of a dual camera system and narrow FoV 202 of a second lens of the dual camera system, and corresponding ToF sensor FoV 222.

Figure 2A:
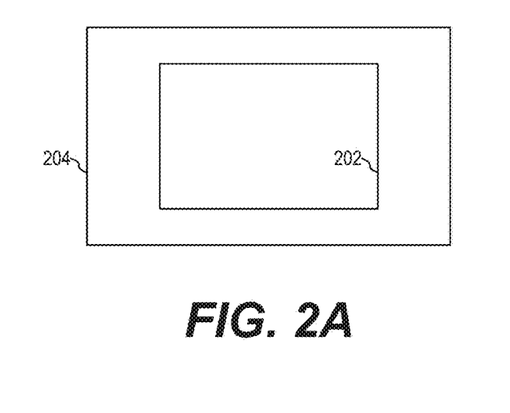
FIGS. 2a and 2b show a wide FoV of a first lens of a dual camera system and a narrow FoV of a second lens of the dual camera system and a corresponding ToF sensor FoV.
Figure 2B:
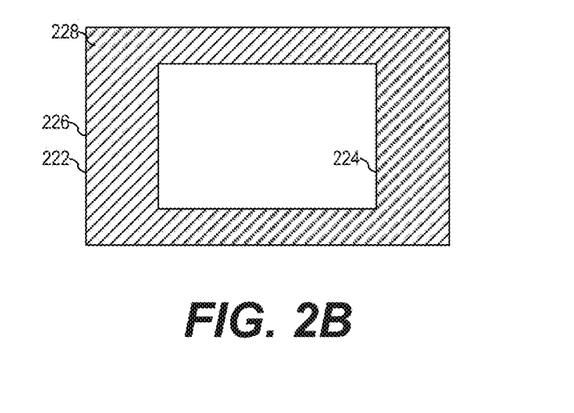

As shown in FIG. 2a, when using the first lens having wide FoV 204, a corresponding portion 226 of ToF sensor FoV 222, which corresponds to the full array of photodetectors of the ToF sensor, is covered. In other words, the FoV of the ToF sensor is equivalent to the FoV of the first lens. As shown in FIG. 2b, when using the second lens having narrow FoV 202, only portion 224 of the array of photodetectors of ToF sensor 222 captures relevant information while portion 228, which covers the area between portion 226 and 224, does not capture relevant information. For example, portion 228 may capture noise resulting from ambient light entering the ToF sensor.

In the dual camera system just described, AF based on a depth map generated by the full array of photodetectors of the ToF sensor may work improperly when using the second lens, in part, because of the presence of noise in portion 228. The operation of the photodetectors in portion 228 when using the second lens may also consume unnecessary power, since the photodetectors in portion 228 are not collecting information useful for AF when using the second lens.

In some embodiments of the present invention, a dual camera system has a wide camera, a narrow camera, two light sources and a ToF sensor having an electronically configurable array of photodetectors. A first light source is configured to illuminate a wide FoV equivalent to the FoV of the wide camera. A second light source is configured to illuminate a narrow FoV equivalent to the FoV of the narrow camera. The array of photodetectors is configurable to have a FoV equivalent to the FoV of the wide camera when the wide camera is used and is configurable to have a FoV equivalent to the FoV of the narrow camera when the narrow camera is being used. Using two illumination sources allows for matching the illumination FoV with the FoV of the selected camera.

Figure 3A:
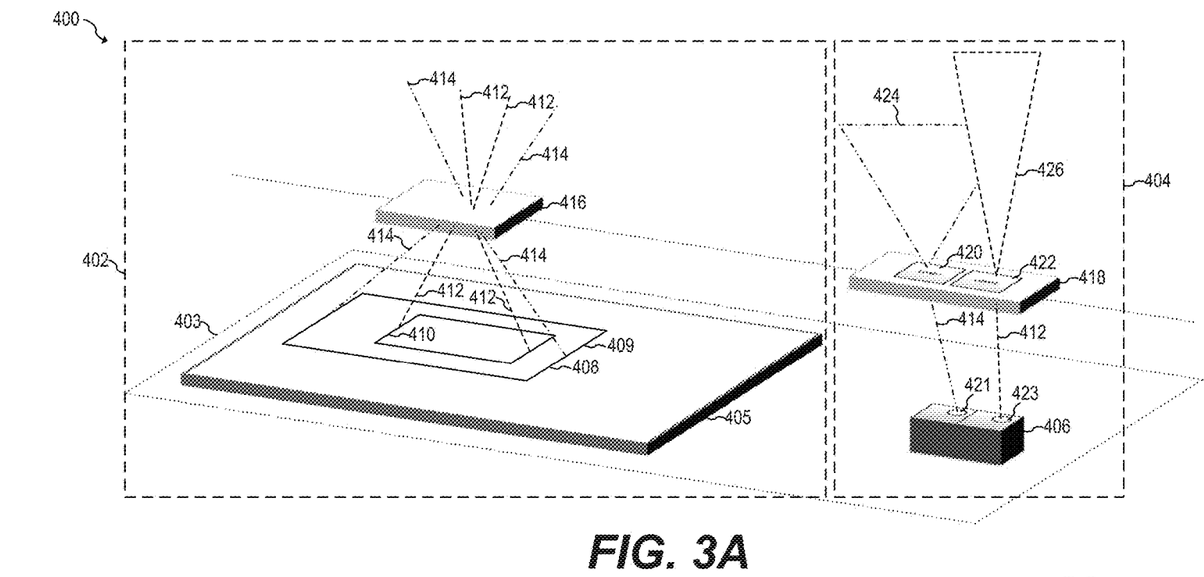
FIG. 3a shows a portion of a dual camera system having a ToF module, which includes a dual illumination module and a ToF sensor, according to an embodiment of the present invention.

FIG. 3a shows a portion of dual camera system 400 having ToF module 403, which includes dual illumination module 404 and ToF sensor 402, according to an embodiment of the present invention. Dual camera system 400 also includes a wide FoV camera (not shown) and a narrow FoV camera (not shown). Dual illumination module 404 includes dual illumination source 406 and dual transmitter (TX) lens 418. Dual illumination source 406 includes light source 421 and light source 423. Dual TX lens 418 includes wide FoV lens 420 and narrow FoV lens 422. ToF sensor 402 includes substrate 405, ToF imaging array 408, and RX lens 416.

During normal operation, ToF module 403 may operate in two different modes. In a first mode, the wide FoV camera is selected for use. In the first mode, light source 421 may be turned on while keeping light source 423 off. The light from light source 421 is projected through wide FoV lens 420 and illuminates wide FoV 424. Objects in wide FoV 424 reflect light coming from light source 421 into RX lens 416, as illustrated by light rays 414. Light rays 414 go through RX lens 416 and illuminate the photodetectors of ToF imaging array 408 surrounded by perimeter 409. The array of photodetectors surrounded by perimeter 409 is selected and used to generate ranging information, such as histograms. As discussed below with respect to FIG. 3b, each ToF zone (represented by dotted lines in FIG. 3b) may generate a histogram. The information generated by the array of photodetectors selected may be supplied to the AF module to automatically focus the wide FoV camera on the objects in wide FoV 424.

In a second mode, the narrow FoV camera is selected for use. In the second mode, light source 423 may be turned on while keeping light source 421 off. The light from light source 423 is projected through narrow FoV lens 422 and illuminates narrow FoV 426. Objects in narrow FoV 426 reflect light coming from light source 423 into RX lens 416, as illustrated by light rays 412. Light rays 412 go through RX lens 416 and illuminate the photodetectors of ToF imaging array 408 surrounded by perimeter 410. The array of photodetectors surrounded by perimeter 410 is selected and used to generate ranging information, such as histograms. As discussed below with respect to FIG. 3c, each ToF zone (represented by dotted lines in FIGS. 3c) may generate a histogram. The photodetectors of the array of photodetectors that are not surrounded by perimeter 410 may be turned off. The information generated by the array of photodetectors selected may be supplied to the AF module to automatically focus the narrow FoV camera on the objects in narrow FoV 426.

Dual illumination source 406 may be implemented in ways known in the art. For example, dual illumination source may be implemented with two VCSELs that are independently controlled. Other illumination technologies may be used.

Dual illumination source 406 may be configured to provide light having a single wavelength. In some embodiments, multiple wavelengths may be used. For example, a first VCSEL may provide light with a first wavelength and a second VCSEL may provide light with a second wavelength, where the first and the second VCSELs are independently controlled.

Dual illumination source 406 may be implemented in a single package. Alternatively, dual illumination source may be implemented discretely, having a first illumination source on a first package and a second illumination source on a second package different from the first package. Other implementations are also possible.

Dual TX lens 418 is located between dual illumination source 406 and the objects to be illuminated. Dual TX lens 418 may be implemented in a single module having a wide TX lens with a fixed wide FoV and a narrow TX lens with a fixed narrow FoV. The FoV of the wide TX lens may be between 60° and 80° diagonal. Other FoVs outside this range may be used. The FoV of the narrow TX lens may be less than the FOV of the wide TX lent, such as, for example, between 10° and 25° diagonal. Other FoVs outside this range may be used.

In some embodiments, dual TX lens 418 may be implemented with a discrete, fixed wide FoV lens in a first module and a discrete, fixed narrow FoV lens in a second module separate from the first module. In some embodiments, one or both of the lenses in dual TX lens 418 may have an adjustable FoV. Other implementations are also possible.

RX lens 416 is typically located between the objects being illuminated by dual illumination source 406 and ToF imaging array 408. RX lens 416 may be a fixed lens with a fixed FoV. In some embodiments, RX lens may have an adjustable FoV.

RX lens 416 may be implemented discretely. Alternatively, RX lens 416 may be implemented in the same module as dual TX lens 418. For example, RX lens and TX lens may be manufactured separately and then integrated into the same package. Other implementations are also possible.

RX lens 416 may be implemented without a diffractive optical element (DOE). In some embodiments, RX lens may be implemented with a DOE. In some embodiments, RX lens 416 may be located next to (adjacent) dual TX lens 418 and next to the lenses of the wide FoV camera and the narrow FoV camera of dual camera system 400. In other words, dual TX lens 418, RX lens 416 and the lenses of the wide FoV camera and the narrow FoV camera may be located in the same plane and near each other. For example, dual TX lens 418, RX lens 416 and the lenses of the wide FoV camera and the narrow FoV camera may be located less than 10 mm from each other. In other embodiments, dual TX lens 418, RX lens 416 and the lenses of the wide FoV camera and the narrow FoV camera may be separated by more than 1 cm, such as 10 cm, or may not be adjacent to each other.

ToF imaging array 408 has a plurality of photodetectors that may be turned on or off based on an external signal (not shown). ToF imaging array 408 may supply distance information from all of the photodetectors of the array or from a selected group of photodetectors for range extraction. The distance information may be supplied via a plurality of analog ToF channels. In some embodiments, the distance information may be supplied via a plurality of digital ToF channels. A digital communication protocol, such as SPI, $I^2C$, $I^2S$, or similar may also be used to provide distance information. In some embodiments, the distance information includes a sequence of ToF times. Other ways of representing distances may be used.

The array of photodetectors of ToF imaging array 408 may be implemented with an array of SPADs. Other photodetectors may be used.

A controller (not shown) may be used to control ToF module 403. For example, the controller may be used to activate or deactivate illumination sources of dual illumination source 406. The controller may be used to extract information from ToF imaging array 408 as well as to control which photodetectors of ToF imaging array 408 are activated and which are deactivated. For example, activation and deactivation of particular photodetectors of ToF imaging array 408 may be controlled as shown in co-pending U.S.

patent application Ser. No. 15/588,127, which is hereby incorporated by reference in its entirety. The controller may also be used to generate the histogram of distances from the selected photodetectors.

The controller may be implemented as a single general purpose controller or as a single custom controller. In some embodiments, the controller may be implemented as a group of controller. Other implementations are also possible.

The array of photodetectors of ToF imaging array 408, and the controller may all be implemented in the same integrated circuit (IC). For example, an IC may include an array of SPADs used for a ToF imaging array, a circuit for controlling the array of SPADs and the VCSELs and a custom controller. Alternatively, the array of photodetector, the VCSELs and the controller and the circuit for controlling the array of SPADs and the VCSEL may be implemented discretely. Other implementations are also possible.

The operational distance of AF using ToF module 403 may depend on parameters, such as the power of the illumination sources, the type of TX lens used, the sensitivity of the photodetectors, and other parameters. A typical AF application for a mobile phone may have an operational range between 0 m and 10 m, for example. Different ranges may also be achieved. In some embodiments, ToF module 403 may achieve substantially longer ranges, such as 200 m, which may be advantageous, for example, in automotive LIDAR.

Advantages of some embodiments include that the FoV of the ToF imaging sensor may be configured to match the FoV of a selected camera. Having a matching FoV may result in more accurate AF with either the narrow FoV camera of the wide FoV camera. By electronically configuring the ToF imaging array (without any mechanical changes), a faster response time may be obtained when compared with systems that mechanically adjust the FoV of the ToF sensor.

Other advantages of some embodiments include that by using two illumination sources, the area of interest may be illuminated without illuminating other areas, which may result in more accurate AF. By turning off photodetectors that are not being used, power may be saved. Another advantage of some embodiments include that the higher photon rate associated with the narrow FoV may result in a ToF sensor generating distance (e.g. range) measurements faster and/or more accurate when operating with a narrow FoV, thereby increasing performance when using narrow FoV camera.

Figure 3B:
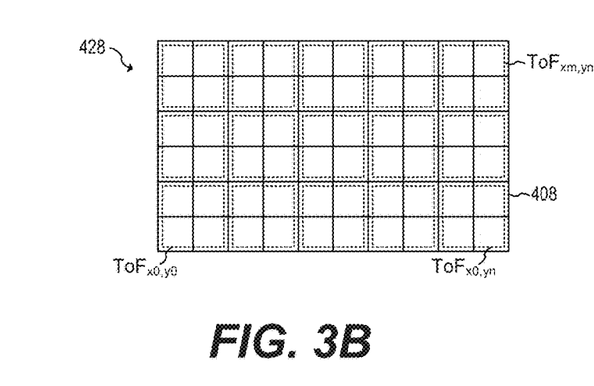
FIGS. 3b and 3c show a ToF imaging array having a wide FoV configuration and a narrow FoV configuration, respectively, according to an embodiment of the present invention.
Figure 3C:
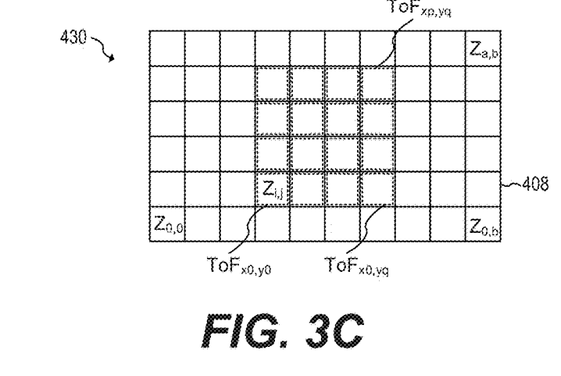

FIGS. 3b and 3c show ToF imaging array 408 having wide FoV configuration 428 and narrow FoV configuration 430, respectively, according to an embodiment of the present invention. ToF imaging array includes a-1 rows and b-1 columns, for a total of (a-1)*(b-1) photodetector zones. Each zone, such as, for example, zone $Z_{0,0}$, may include a single photodetector or a cluster (e.g. a plurality) of photodetectors. For example, some embodiments include 42 zones arranged in an array of 6 rows and 7 columns of SPADs. The SPADs may be arranged in a semiconductor substrate of an integrated circuit and may be implemented in a Complementary metal-oxide-semiconductor (CMOS) process, for example. A higher number of photodetectors or a smaller number of photodetectors may also be used. Other arrangements may also be used. As another example, some embodiments may include 16 rows and 16 columns of photodetectors for a total of 256 photodetectors. Arrays with higher number of photodetectors, such as 10,000 or more, may be used.

ToF imaging array 408 has a plurality of ToF channels, which are used to transmit distance information to an external circuit or system, such as a controller or an AF module. Each ToF channel may be associated with a zone. Each ToF channel may transmit a single distance. In some embodiments, each ToF channel may transmit a plurality of distances, such as a histogram of distances. In some embodiments, each ToF channel may transmit different amount of information based on the FoV configuration selected. For example, each ToF channel may transmit a single distance when ToF imaging array 408 is configured with a narrow FoV and may transmit multiple distances arranged in a histogram of distances when ToF imaging array 408 is configured with a wide FoV. In other embodiments, each ToF channel transmits the same amount of information regardless of the FoV configuration selected. The information transmitted by the ToF channels may be used for AF. For example, the information may be used for touch to focus, where the ranging information of the selected zone is used for focusing purposes. In some embodiments, if no zone is selected, the system may default to focusing to a predetermined zone, such as a zone in the center of the FoV.

Each ToF channel may transmit distance information as a histogram of distances. The histogram may be represented, for example, as a set or list of distances. Each distance may be represented, for example, by arrival times. Other ways to represent and/or transmit distances may be used.

In some embodiments, the number of distances transmitted by each ToF channel may be reduced (e.g., filtered) in some modes of operation.

As shown in FIG. 3b, ToF imaging array 408 operates m-1 rows and n-1 columns of ToF channels, for a total of m×n ToF channels, when wide FoV configuration 428 is selected. Each ToF channel includes four photodetector zones. For example, ToF channel $ToF_{x0,y0}$ is configured to transmit a histogram of distances captured by photodetector zones $Z_{0,0}$, $Z_{0,1}$, $Z_{1,0}$, and $Z_{1,1}$. In some embodiments, each ToF channel may include a different number of photodetector zones, such as a single photodetector zone, two zones, three zones, or more than four zones.

As shown in FIG. 3b, all of the photodetectors of ToF imaging array 408 are used when wide FoV configuration 428 is selected. In some embodiments, some of the photodetectors may not be used and may be turned off. Such configuration may be advantageous when the FoV of the ToF imaging array when using all of the photodetectors does not match the FoV of the wide camera.

As shown in FIG. 3c, ToF imaging array 408 operates p-1 rows and q-1 columns of ToF channels, for a total of p×q ToF channels, when narrow FoV configuration 430 is selected. Each ToF channel includes a single photodetector zone. For example, ToF channel $ToF_{x0,y0}$ is configured to transmit a single distance or a histogram of distances captured by photodetector zone $Z_{i,j}$, where $Z_{i,j}$ denotes a zone at an origin of the FoV of the narrow FoV camera. In some embodiments, each ToF channel may include a different number of photodetector zones, such as two zones, three zones, or more than three zones.

In the particular example illustrated in FIGS. 3b and 3c, when ToF imaging array 408 operates in a first mode (wide FoV configuration 428), an array of 5×3 ToF channels are used to transmit ranging information. When ToF imaging array 408 operates in a second mode (narrow FoV configuration 430), an array of 4×4 ToF channels are used to transmit ranging information. A different number of ToF channels and different arrangements of ToF channels may be used. As shown in FIG. 3b and 3c, ToF imaging array 408 may be reconfigured to match a particular FoV.

In some embodiments p is equal to m, and q is equal to n. In other words, the number of ToF channels used when wide FoV configuration 428 is selected is the same as the number of ToF used when narrow FoV configuration 430 is selected. Having such configuration may be advantageous because a controller or AF module receiving the ToF information from ToF imaging array 408 does not need to perform additional computations based on how ToF imaging array 408 is configured. For example, at a first time, a controller may configure ToF imaging array 408 with wide FoV 428 and process information from the m×n ToF channels in a first way. At a second time, the controller may configure ToF imaging array 408 with narrow FoV 430 and process information from the same m×n ToF channels in the same first way. Other embodiments may have p being less than or greater than m, and may have q being less than or greater than n.

Dual camera system 400 may also be configured to perform touch-to-focus with either the wide FoV camera or the narrow FoV camera. For example, a particular ToF channel associated with a particular zone may be selected to perform AF while ignoring the information from other ToF channels. In some embodiments, the photodetectors associated with the unselected zones are deactivated when performing the distance measurements and AF.

As shown in FIGS. 3b and 3c, ToF imaging array 408 may be configured to have at least two fields of view. For example, a first FoV equivalent to a wide FoV camera and a second FoV equivalent to a narrow FoV camera. Some embodiments may have a ToF imaging array that is configurable to have multiple FoVs, such as, for example, three FoV, four FoV, or more than four FoV. Such a multiple FoV ToF imaging array may be used in systems with more than two cameras. The multiple FoV ToF imaging array may also be capable of being implemented with different camera models having different FoV without having to modify the hardware of the ToF imaging array.

Figure 3D:
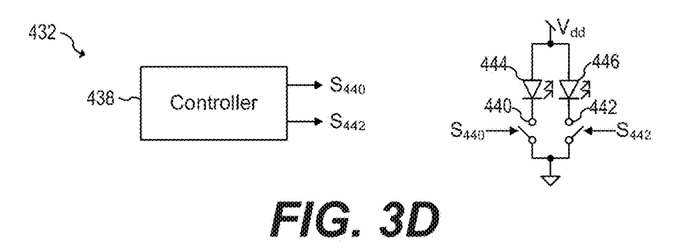
FIG. 3d shows a circuit for driving a dual illumination source, according to an embodiment of the present invention.

FIG. 3d shows circuit 432 for driving dual illumination source 406, according to an embodiment of the present invention. Circuit 432 includes controller 438, switches 440 and 442 and VCSELs 444 and 446.

The anodes of VCSELs 444 and 446 may be connected to each other, and may receive power from a power supply at terminal $V_{dd}$, such as a charge pump, linear regulator, or any other power source. Switches 440 and 442 are respectively connected in series with VCSELs 444 and 446 and are configured to connect or disconnect the cathodes of the respective VCSELs to/from a reference voltage (e.g. ground).

During normal operation, a positive voltage is received at terminal $V_{dd}$. When switch 440 is closed (e.g. on), VCSEL 444 generates light. When switch 440 is open (e.g. off), VCSEL 444 does not generate light. Similarly, when switch 442 is closed, VCSEL 446 generates light and when switch 442 is open, VCSEL 446 does not generate light.

Switches 440 and 442 may be controlled by controller 438 with signals $S_{440}$ and $S_{442}$, respectively. For example, when signal $S_{440}$ is high, switch 440 is on, and when signal $S_{440}$ is low, switch 440 is off. Similarly, when signal $S_{442}$ is high, switch 442 is on, and when signal $S_{442}$ is low, switch 442 is off. It is understood that other implementations are also possible, such as, for example, by using switches and signals of opposite polarities, and/or by placing VCSELs 444 and 446 between switches 440 and 442 and ground instead of between $V_{dd}$ and switches 440 and 442.

Switches 440 and 442 may be implemented in any way known in the art. For example, switches 440 and 442 may be transistors of the n-type or p-type, such as metal-oxide-semiconductor field-effect transistors (MOSFETs), bipolar junction transistors (BJT), or any other transistor technology. Alternatively, other switch implementations may be used, such as, for example, mechanical relays.

Figure 3E:
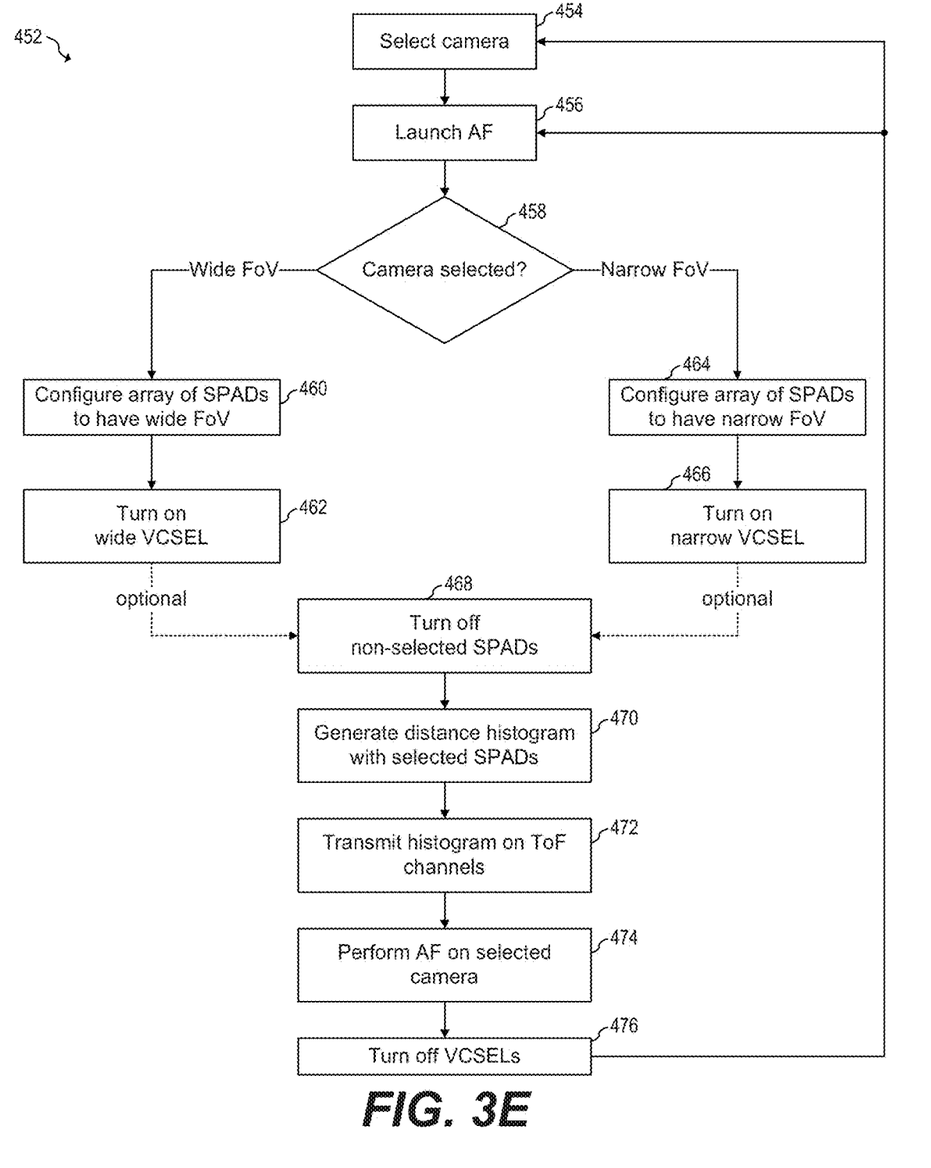
FIG. 3e shows a flow chart of an embodiment method of operating a dual camera system, according to an embodiment of the present invention.

FIG. 3e shows a flow chart of embodiment method 452 of operating a dual camera system, according to an embodiment of the present invention. Method 452 may be used to electrically reconfigure ToF imaging array 408 to have a FoV equivalent to the FoV of a selected camera and use the output of ToF imaging array 408 to automatically focus the selected camera on the objects of interest. Method 408 may be implemented with dual camera system 400. Alternatively, method 408 may be implemented in other camera systems, such as, for example, a camera system having more than two cameras. The discussion that follows assumes that dual camera system 400, as shown in FIGS. 3a-3d, implements method 452.

During step 454 a camera, such as a narrow FoV camera or a wide FoV camera, is selected. During step 456, AF is launched. Depending on the camera selected during step 454, a different VCSEL is activated and a ToF imaging array, such as ToF imaging array 408, is reconfigured in a different way. For example, if it is determined during step 458 that wide FoV camera is selected, the ToF imaging array is configured, during step 460, to have a wide FoV equivalent to the FoV of the selected camera and the wide light source, such as light source 421, is turned on according to ToF techniques during step 462.

Alternatively, if it is determined during step 458 that narrow FoV camera is selected, the ToF imaging array is configured, during step 464, to have a narrow FoV equivalent to the FoV of the selected camera and the narrow light source, such as light source 423, is turned on according to ToF techniques during step 466. Any non-selected photodetector of the ToF imaging array may be turned off during step 468. In some embodiments, step 466 may be replaced with step 462 because an illumination source with a wide FoV may illuminate objects in the narrow FoV.

The selected photodetectors of the ToF imaging array are used to generate a distance histogram during step 470. Such histogram is transmitted to a controller or the AF module using the ToF channels during step 472. The controller or AF module receives the distance histogram and performs AF of the selected camera based on the received distance histogram during step 474. The AF may be performed, for example, by controlling a lens driver to focus the lens of the selected camera. The light source that was turned on during either step 462 or step 466 is turned off during step 476. The sequence may be repeated if a different camera is selected, or AF is launched again.

It is understood that some of the steps shown in FIG. 3e may be performed in a different order. For example, step 468 may be performed before step 462 or step 466. Steps 460 and 464 may be performed once a camera is selected n step 454 but before step 456 is executed.

Figure 4:
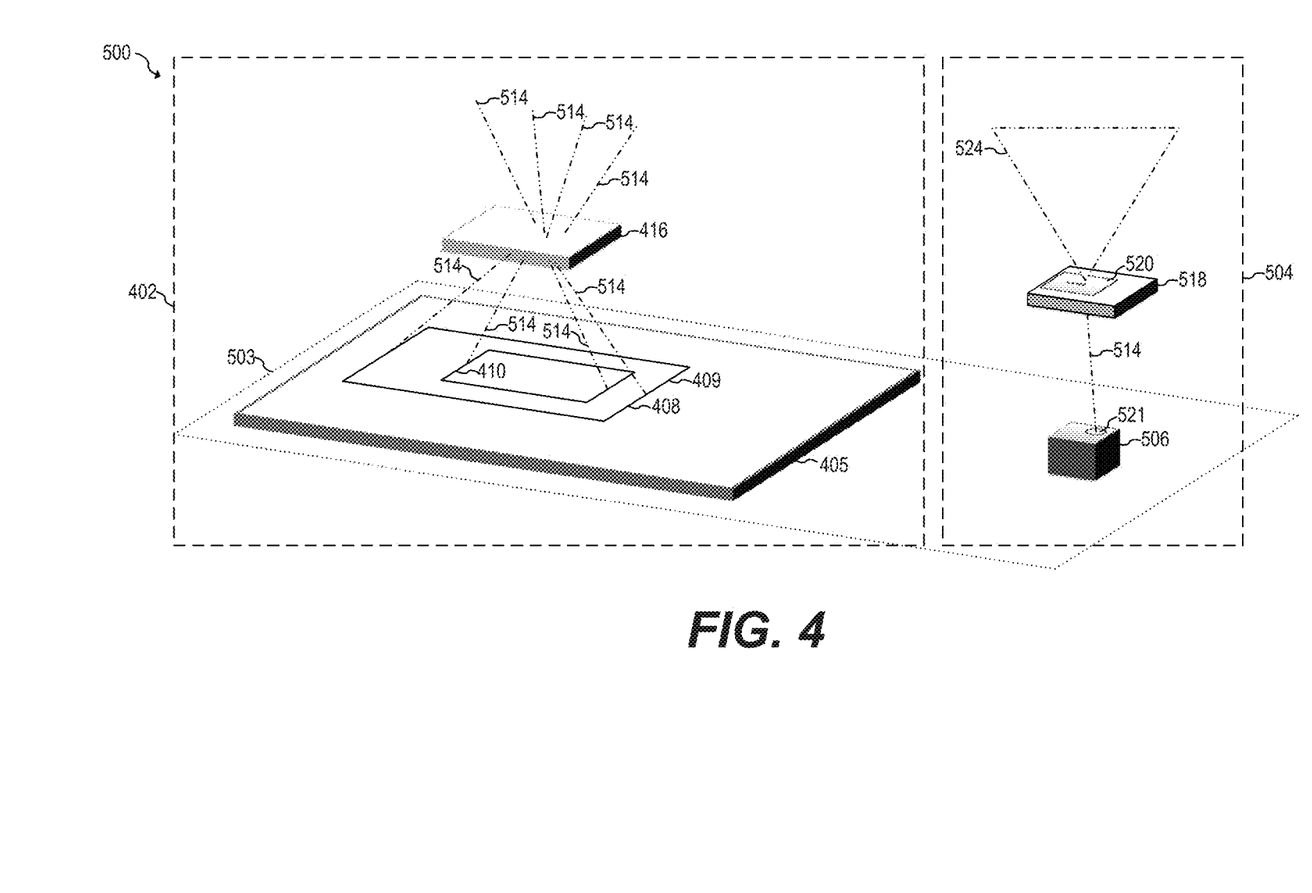
FIG. 4 shows a portion of a dual camera system having a ToF module, which includes a single illumination module and a ToF sensor, according to another embodiment of the present invention.

A configurable ToF imaging array may be used in a system having more than two illumination sources as well as in systems with a single illumination source. For example, FIG. 4 shows a portion of dual camera system 500 having ToF module 503, which includes single illumination module 504 and ToF sensor 402, according to an embodiment of the present invention. Dual camera system 500 is similar to dual camera system 400. Dual camera system 500, however, includes single illumination source 506 and single TX lens 518 instead of dual illumination source 406 and dual TX lens 418. Single illumination source 506 includes light source 521. Single TX lens 518 includes wide FoV lens 520.

Dual camera system 500 operates in a similar manner than dual camera system 400. Dual camera system 500, however, uses the same illumination source 521 for AF regardless of which camera is selected. For example, dual camera system 500 may implement steps 454, 456, 458, 460, 462, 464, 468, 470, 472, 474, and 476 of method 452, as shown in FIG. 3*e*. Step 466, however, is replaced with step 462.

Advantages of some embodiments include avoiding having multiple illumination sources, which may increase the cost of the solution as well as the size of the system. Even though when using the narrow FoV camera with a wide FoV illumination source may result in illuminating objects that are not within the FoV of the narrow FoV camera, the distance histograms generated by the ToF imaging array may not be impacted. Any deficit in photon rate that may be caused by using a wide FoV illumination source may be compensated by increasing the intensity of the illumination source when narrow FoV camera is being used. For example, in a system implementing single illumination source 506 with a VCSEL, more current may be flown through the VCSEL up to a maximum current when the narrow FoV camera is being used than when the wide FoV camera is being used. The maximum current may be determined, for example, based on a laser intensity safety threshold.

Figure 5A:
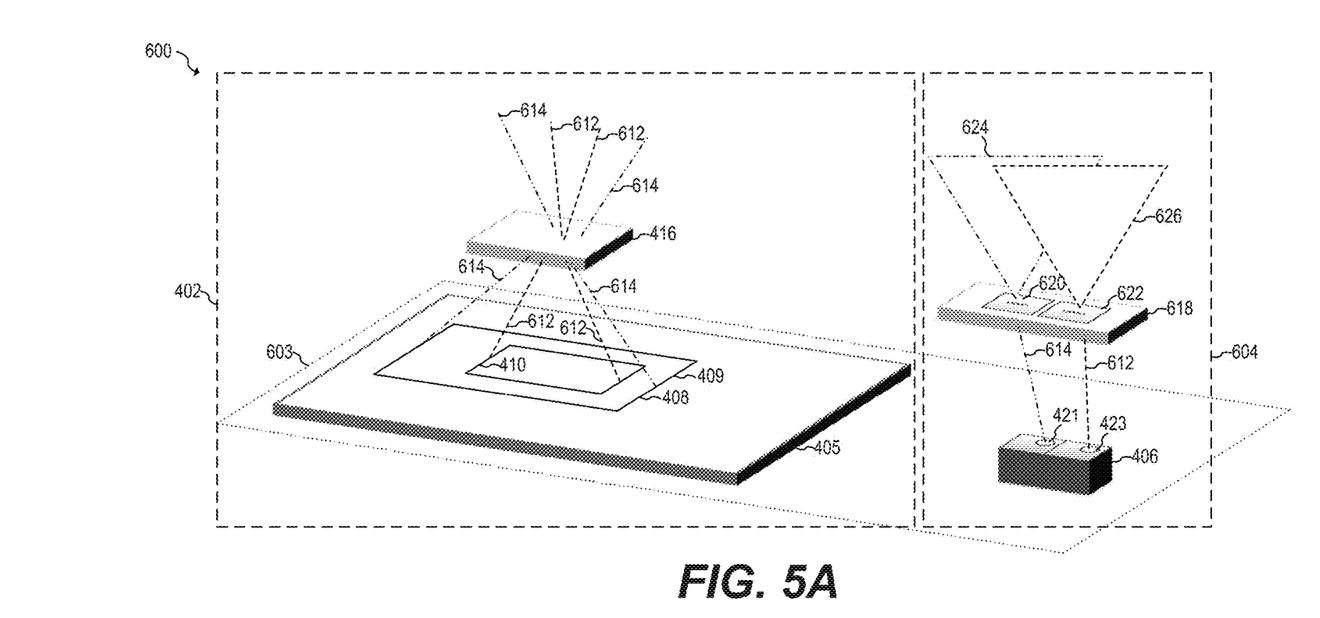
FIG. 5a shows a portion of a dual camera system having a ToF module, which includes a dual illumination module and a ToF sensor, according to yet another embodiment of the present invention.

In some embodiments of the present invention, a camera system achieves a flat FoV by combining two light sources to illuminate objects with a ToF sensor having an electronically configurable array of photodetectors and having a dual TX lens including a diffractive optical element (DOE). For example, FIG. 5*a* shows a portion of dual camera system 600 having ToF module 603, which includes dual illumination module 604 and ToF sensor 402, according to an embodiment of the present invention. Dual camera system 600 is similar to dual camera system 400. Dual camera system 600, however, includes dual TX lens 618 instead of dual TX lens 418. Dual TX lens 618 includes corner-weighted FoV lens 620 and center-weighted FoV lens 622. Even though lenses 620 and 622 have different weighting, the FoV of lenses 620 and 622 cover the same area, as shown by FoV 624 and 626, respectively. The particular weighing of the lenses may be achieved, for example, using DOE.

Figure 5B:
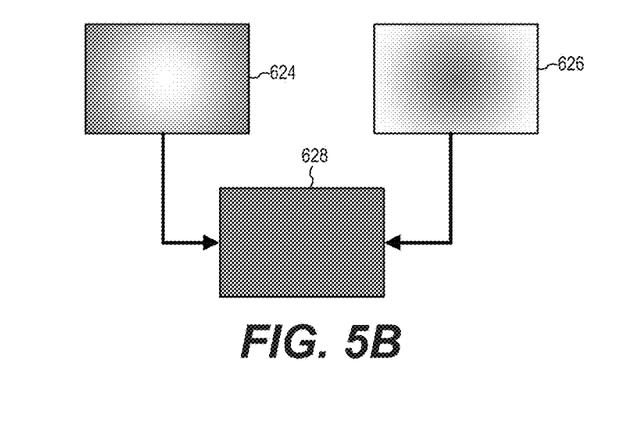
FIG. 5b shows a corner-weighted FoV, a center-weighted FoV, and a combined, flat FoV of a dual transmitter (TX) lens, according to an embodiment of the present invention.

FIG. 5*b* shows corner-weighted FoV 624, center-weighted FoV 626, and combined, flat FoV 628 of dual TX lens 618, according to an embodiment of the present invention. FIG. 5*b* may be understood in view of FIG. 5*a*. As shown in FIGS. 5*a* and 5*b*, when light source 423 projects light through center-weighted FoV lens 622, center-weight FoV 626 is illuminated. Center-weight FoV 626 has more energy at the center of the FoV than at the edges. Such FoV may be advantageous, for example, for performing AF at long distances, where a ToF sensor may need more optical power in the center than in the edges. A flat FoV may be achieved by having both illumination sources 421 and 423 on simultaneously, which results in flat FoV 628. Such flat FoV may be advantageous for performing AF for all distances.

Dual camera system 600 may be used for performing AF in a system having a first camera and a second camera, where the FoVs of both cameras are the same. The first camera may be a color camera and the second camera may be a black and white (B&W) camera. Other types of cameras may be used. It is understood that, in some embodiments, the FoVs of each camera of dual camera system 600 cameras may not be exactly the same for all conditions. For example, a discrepancy (e.g., misalignment) in FoV between each of the cameras of dual camera system 600 may exist for short distances due to parallax. There may also be a discrepancy or misalignments between FoV for long distances due to calibration issued between each camera. By having a ToF sensor with configurable FoV, such as ToF sensor 402, a correct FoV for capturing ToF information may be selected for each camera.

Dual camera system 600 may use both illumination sources 421 and 423 simultaneously for short and mid-range AF (e.g., less than 2 m of distance), and may use illumination source 423 for performing long distance AF (e.g., more than 2 m of distance). In some embodiments, when operating with illumination source 423 on and illumination source 421 off, the array of photodetectors surrounded by perimeter 410 is selected and used for ranging while photodetectors outside perimeter 410 are not selected.

In some embodiments, when operating with illumination source 423 on and illumination source 421 off, the intensity of light generated by illumination source 423 may be increased compared to when both illumination sources 421 and 423 are on. The intensity of light may be increased, for example, by increasing the current flowing through a VCSEL of illumination source 423.

Figure 6A:
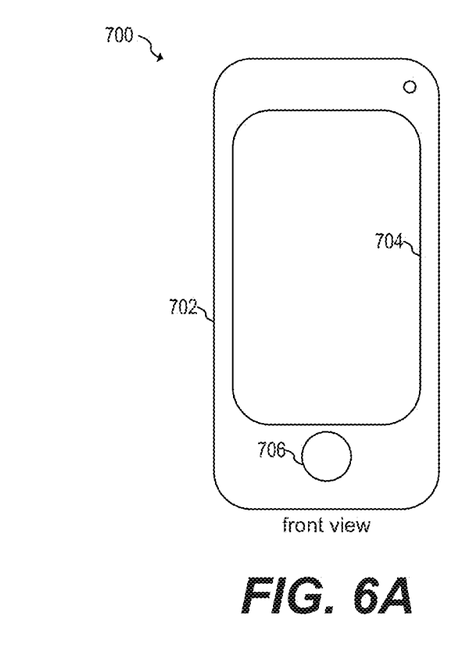
FIGS. 6a and 6b show the front and back view, respectively, of a mobile phone including a back-facing dual camera module and a ToF sensor, according to an embodiment of the present invention.
Figure 6B:
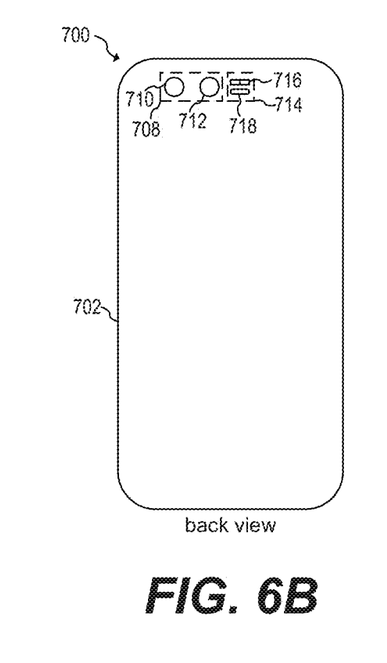

FIGS. 6*a* and 6*b* show the front and back view, respectively, of mobile phone 700 including back-facing dual camera module 708 and ToF sensor 714, according to an embodiment of the present invention. Mobile phone 700 includes case 702, button interface 706, touchscreen 704, dual camera module 708 and ToF sensor 714. Dual camera module 708 includes first camera 710 and second camera 712. ToF sensor 714 includes dual TX lens 716, dual VCSEL (not shown), RX lens 718 and ToF imaging array (not shown). Dual VCSEL is disposed behind dual TX lens 716, where each of the VCSELs of the dual VCSEL is configured to project light through each of the TX lenses of dual TX lens 716. ToF imaging array is disposed behind RX lens 718, where ToF imaging array is configured to receive light coming through RX lens 718.

Mobile phone 700 may implement any of the embodiments described herein. For example, first camera 710 and second camera 712 may be implemented, for example, as a wide FoV camera and narrow FoV camera, respectively. In some embodiments, first camera 710 and second camera 712 may be implemented as a color camera with a wide FoV and a B&W camera with a wide FoV, where the FoV of the color camera and the B&W camera cover the same area.

In some embodiments, ToF sensor 714 may be positioned between first camera 710 and second camera 712. Even though such arrangement may increase parallax between first camera 710 and second camera 712, it would equalize parallax between ToF sensor 714 and first camera 710 and second camera 712.

It is understood that the physical arrangement of the cameras and ToF sensor in the phone may be different. For example, in some embodiments, the cameras and ToF sensor may be disposed in the front side of mobile phone 700. In other embodiments may arrange the order of the cameras, TX lenses and RX lens differently.

Figure 7:
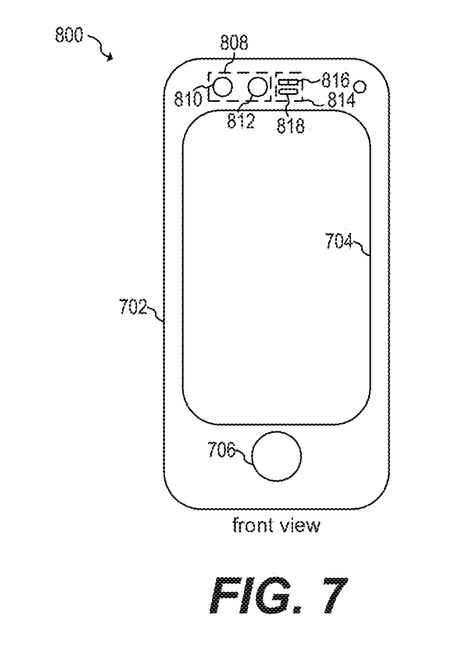
FIG. 7 shows the front view of a mobile phone including a front-facing dual camera module 808 and ToF sensor 814, according to an embodiment of the present invention.

In some embodiments, a mobile phone may include a ToF sensor that is associated with a front-facing camera. For example, FIG. 7 shows the front view of mobile phone 800 including front-facing dual camera module 808 and ToF sensor 814, according to an embodiment of the present invention. Dual camera module 808 and ToF sensor 814 may operate in a similar camera than dual camera module 708 and ToF sensor 714.

It is understood that a mobile phone may include just a front-facing dual camera module 808 and ToF sensor 814, just a back-facing dual camera module 708 and ToF sensor 714 or both. Other implementations are also possible.

One general aspect includes a time of flight (ToF) sensor including: an illumination source module having a first vertical-cavity surface-emitting laser (VCSEL); a transmitter (TX) lens module located between the illumination source module and a scene, the TX lens module having a first TX lens, where the first VCSEL is configured to project light through the first TX lens; an integrated circuit (IC) including a ToF imaging array configured to measure distances to objects in the scene, the ToF imaging array including a plurality of single photon avalanche diodes (SPAD), a plurality of ToF channels coupled to the plurality of SPADs, where: in a first mode, the ToF imaging array is configured to select a first group of SPADs from the plurality of SPADs, the first group of SPADs corresponding to a first field of view (FoV), the ToF imaging array also configured to measure distances to objects in the scene corresponding to the first FoV, where the plurality of ToF channels are configured to transmit ToF data corresponding to the first FoV, and in a second mode, the ToF imaging array is configured to select a second group of SPADs from the plurality of SPADs, the second group of SPADs corresponding to a second FoV different than the first FoV, the ToF imaging array also configured to measure distances to objects in the scene corresponding to the second FoV, where the plurality of ToF channels are configured to transmit ToF data corresponding to the second FoV; and a received (RX) lens located between the scene and the ToF imaging array.

Implementations may include one or more of the following features. The ToF sensor where the ToF imaging array is further configured to generate a depth map. The ToF sensor where the illumination source module further includes a second VCSEL, where the TX lens module further includes a second TX lens, and where the second VCSEL is configured to project light through the second TX lens. The ToF sensor where the first TX lens has a wide FoV and the second TX lens has a narrow FoV. The ToF sensor where the first TX lens has a corner-weighted FoV and the second TX lens has a center-weighted FoV. The ToF sensor where the first TX lens includes a first diffractive optical element and the second TX lens includes a second diffractive optical element. The ToF sensor where a combination of the corner-weighted FoV of the first TX lens with the center-weighted FoV of the second TX lens results in a flat FoV.

Another general aspect includes a system including: an illumination source module having a first illumination source; a transmitter (TX) lens module located between the illumination source module and a scene, the TX lens module having a first TX lens, where the first illumination source is configured to project light through the first TX lens; a time of flight (ToF) imaging array configured to measure distances to objects in the scene, the ToF imaging array including a plurality of photodetectors, a plurality of ToF channels coupled to the plurality of photodetectors, where: in a first mode, the ToF imaging array is configured to select a first group of photodetectors from the plurality of photodetectors, the first group of photodetectors corresponding to a first field of view (FoV), and measure distances to objects in the scene corresponding to the first FoV, and the plurality of ToF channels are configured to transmit ToF data corresponding to the first FoV, and in a second mode, the ToF imaging array is configured to select a second group of photodetectors from the plurality of photodetectors, the second group of photodetectors corresponding to a second FoV different than the first FoV, and measure distances to objects in the scene corresponding to the second FoV, and the plurality of ToF channels are configured to transmit ToF data corresponding to the second FoV; and a received (RX) lens located between the scene and the ToF imaging array.

Implementations may include one or more of the following features. The system where, in the second mode, a group of unselected photodetectors of the plurality of photodetectors is configured to be turned off before the ToF imaging array measures distances to objects in the scene, where the group of unselected photodetectors and the second group of photodetectors are mutually exclusive. The system where the first FoV is a wide FoV and the second FoV is a narrow FoV. The system where each ToF channel is configured to transmit data associated with respective first groups of photodetectors when the ToF imaging array is in the first mode, and where each ToF channel is configured to transmit data associated with respective second groups of photodetector when the ToF imaging array is in the second mode. The system where the respective first groups of photodetectors include more than one photodetector and where the respective second groups of photodetectors include more than one photodetector. The system where the respective second groups of photodetectors include one photodetector. The system where each photodetector includes a single photon avalanche diode (SPAD). The system where the plurality of photodetectors are arranged in rows and columns on a semiconductor substrate of an integrated circuit (IC). The system where the first illumination source includes a vertical-cavity surface-emitting laser (VCSEL). The system further including a dual camera module having a first camera and a second camera, where: the illumination source module further includes a second illumination source; and the TX lens module further includes a second TX lens, where the second illumination source is configured to project light through the second TX lens. The system where the TX lens module is located adjacent to lenses of the dual camera module and to the RX lens. The system further including an autofocus (AF) module configured to receive ToF data from the ToF channels and to focus the dual camera module on objects of the scene based on the received ToF data. The system where the first FoV corresponds to a FoV of the first camera, and the second FoV corresponds to a FoV of the second camera. The system where the first TX lens has a wide FoV and the second TX lens has a narrow FoV. The system where the first TX lens has a corner-weighted FoV and the second TX lens has a center-weighted FoV. The system where the first TX lens includes a diffractive optical element (DoE) and the second TX lens includes a DoE. The system where the system includes a mobile phone. The system where the system includes an automotive light detection and ranging (lidar) system.

Yet another general aspect includes a method including: at a first time, selecting a first camera of a dual camera system having the first camera and a second camera, the first camera having a first field of view (FoV) and the second camera having a second FoV, projecting a first light from a first illumination source through a first transmitter (TX) lens, electrically configuring a time of flight (ToF) imaging array to have a FoV equivalent to the first FoV, capturing the first light with the ToF imaging array after the first light reflects from objects in the first FoV, and transmitting ToF data associated with the captured first light with a plurality of ToF channels coupled to photodetectors of the ToF imaging array; and at a second time, selecting the second camera, projecting a second light from a second illumination source through a second TX lens, electrically configuring the ToF imaging array to have a FoV equivalent to the second FoV, capturing the second light with the ToF imaging array after the second light reflects from objects in the second FoV, and transmit ToF data associated with the captured second light with the plurality of ToF channels.

Implementations may include one or more of the following features. The method where the first camera has a wide FoV and the second camera has a center-weighted FoV. The method where the first camera has a corner-weighted FoV and the second camera has a narrow FoV. The method further including, at the second time: projecting the first light from the first illumination source through a first TX lens; and capturing the first light with the ToF imaging array after the first light reflects from objects in the first FoV, where the transmitted ToF data corresponds to a flat FoV. The method where projecting the first light from the first illumination source through the first TX lens includes turning on a first vertical-cavity surface-emitting laser (VCSEL). The method further including: receiving, with an autofocus (AF) module, ToF data captured with the ToF imaging array; and adjust a lens of the dual camera system with the AF module based on the ToF data received by the AF module.

Another general aspect includes a mobile phone including: a dual camera module having a first camera and a second camera, where the first camera has a first field of view (FoV) and the second camera has a second FoV; a dual illumination source having a first light source and a second light source; a dual transmitter (TX) lens located between the dual illumination source and a scene, the dual TX lens including a first TX lens and a second TX lens, where the first light source is configured to project light through the first TX lens, and the second light source is configured to project light through the second TX lens; a time of flight (ToF) imaging array configured to measure distances to objects in the scene, the ToF imaging array including a plurality of photodetectors, a plurality of ToF channels coupled to the plurality of photodetectors, where: in a first mode, the ToF imaging array is configured to select a first group of photodetectors from the plurality of photodetectors, the first group of photodetectors corresponding to the first FoV, and measure distances to objects in the scene corresponding to the first FoV, and the plurality of ToF channels are configured to transmit ToF data corresponding to the first FoV, and in a second mode, the ToF imaging array is configured to select a second group of photodetectors from the plurality of photodetectors, the second group of photodetectors corresponding to the second FoV different than the first FoV, and measure distances to objects in the scene corresponding to the second FoV, and the plurality of ToF channels are configured to transmit ToF data corresponding to the second FoV; a received (RX) lens located between the scene and the ToF imaging array; and an au ToF ocus (AF) module configured to receive ToF data from the ToF channels and to focus the dual camera module on objects of the scene based on the received ToF data.

Implementations may include one or more of the following features. The mobile phone where the dual camera module and the ToF imaging array are located in a back cover of the mobile phone. The mobile phone further including: a second dual camera module located in a front cover of the mobile phone; and a second ToF imaging array located in the front cover of the mobile phone.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A time of flight (ToF) sensor comprising:
   an illumination source module having a first vertical-cavity surface-emitting laser (VCSEL);
   a transmitter (TX) lens module located between the illumination source module and a scene, the TX lens module having a first TX lens, wherein the first VCSEL is configured to project light through the first TX lens;
   an integrated circuit (IC) comprising a ToF imaging array configured to measure distances to objects in the scene, the ToF imaging array comprising
      a plurality of single photon avalanche diodes (SPADs),
      a plurality of ToF channels coupled to the plurality of SPADs, wherein:
         in a first mode, the ToF imaging array is configured to select a first group of SPADs from the plurality of SPADs, the first group of SPADs corresponding to a first field of view (FoV), the ToF imaging array also configured to measure distances to objects in the scene corresponding to the first FoV, wherein the plurality of ToF channels are configured to transmit ToF data corresponding to the first FoV, and
         in a second mode, the ToF imaging array is configured to select a second group of SPADs from the plurality of SPADs, the second group of SPADs being different than the first group of SPADs, the second group of SPADs corresponding to a second FoV different than the first FoV, the ToF imaging array also configured to measure distances to objects in the scene corresponding to the second FoV, wherein the ToF imaging array is configured to turn off a third group of unselected SPADs of the plurality of SPADs before the ToF imaging array measures distances to objects in the scene corresponding to the second FoV, and wherein the plurality of ToF channels are configured to transmit ToF data corresponding to the second FoV; and
   a received (RX) lens located between the scene and the ToF imaging array.

2. The ToF sensor of claim 1, wherein the ToF imaging array is further configured to generate a depth map.

3. The ToF sensor of claim 1, wherein the illumination source module further comprises a second VCSEL, wherein the TX lens module further comprises a second TX lens, and wherein the second VCSEL is configured to project light through the second TX lens.

4. The ToF sensor of claim 3, wherein the first TX lens has a first TX FoV that is wider than a second TX FoV of the second TX lens.

5. The ToF sensor of claim 3, wherein the first TX lens has a first TX FoV that has more energy at edges of the first TX FoV than at a center of the first TX FoV, and the second TX lens has a second TX FoV that has more energy at a center of second TX FoV than at edges of the second TX FoV.

6. The ToF sensor of claim 5, wherein the first TX lens comprises a first diffractive optical element and the second TX lens comprises a second diffractive optical element.

7. The ToF sensor of claim 5, wherein a combination of the first TX FoV of the first TX lens with the second TX FoV of the second TX lens results in a third FoV having uniform energy.

8. A system comprising:
an illumination source module having a first illumination source;
a transmitter (TX) lens module located between the illumination source module and a scene, the TX lens module having a first TX lens, wherein the first illumination source is configured to project light through the first TX lens;
a time of flight (ToF) imaging array configured to measure distances to objects in the scene, the ToF imaging array comprising
a plurality of photodetectors,
a plurality of ToF channels coupled to the plurality of photodetectors, wherein:
in a first mode, the ToF imaging array is configured to select a first group of photodetectors from the plurality of photodetectors, the first group of photodetectors corresponding to a first field of view (FoV), and measure distances to objects in the scene corresponding to the first FoV, and the plurality of ToF channels are configured to transmit ToF data corresponding to the first FoV, and
in a second mode, the ToF imaging array is configured to select a second group of photodetectors from the plurality of photodetectors, the second group of photodetectors being different than the first group of photodetectors and corresponding to a second FoV different than the first FoV, and measure distances to objects in the scene corresponding to the second FoV, and the plurality of ToF channels are configured to transmit ToF data corresponding to the second FoV, wherein a third group of unselected photodetectors of the plurality of photodetectors is configured to be turned off before the ToF imaging array measures distances to objects in the scene corresponding to the second FoV, and wherein the third group of unselected photodetectors and the second group of photodetectors are mutually exclusive; and
a received (RX) lens located between the scene and the ToF imaging array.

9. The system of claim 8, wherein the first FoV has a wider FoV than the second FoV.

10. The system of claim 9, wherein each ToF channel is configured to transmit data associated with respective first groups of photodetectors when the ToF imaging array is in the first mode, and wherein each ToF channel is configured to transmit data associated with respective second groups of photodetector when the ToF imaging array is in the second mode.

11. The system of claim 10, wherein the respective first groups of photodetectors comprise more than one photodetector and wherein the respective second groups of photodetectors comprise more than one photodetector.

12. The system of claim 10, wherein the respective second groups of photodetectors comprise one photodetector.

13. The system of claim 8, wherein each photodetector comprises a single photon avalanche diode (SPAD).

14. The system of claim 8, wherein the plurality of photodetectors are arranged in rows and columns on a semiconductor substrate of an integrated circuit (IC).

15. The system of claim 8, wherein the first illumination source comprises a vertical-cavity surface-emitting laser (VCSEL).

16. The system of claim 8, further comprising a dual camera module having a first camera and a second camera, wherein:

the illumination source module further comprises a second illumination source; and
the TX lens module further comprises a second TX lens, wherein the second illumination source is configured to project light through the second TX lens.

17. The system of claim 16, wherein the TX lens module is located adjacent to lenses of the dual camera module and to the RX lens.

18. The system of claim 16, further comprising an auto-focus (AF) module configured to receive ToF data from the ToF channels and to focus the dual camera module on objects of the scene based on the received ToF data.

19. The system of claim 16, wherein the first FoV corresponds to a first camera FoV of the first camera, and the second FoV corresponds to a second camera FoV of the second camera.

20. The system of claim 16, wherein the first TX lens has a first TX FoV that is wider than a second TX FoV of the second TX lens.

21. The system of claim 16, wherein the first TX lens has a first TX FoV that has more energy at edges of the first TX FoV than at a center of the first TX FoV, and the second TX lens has a second TX FoV that has more energy at a center of second TX FoV than at edges of the second TX FoV.

22. The system of claim 21, wherein the first TX lens comprises a diffractive optical element (DOE) and the second TX lens comprises a DOE.

23. The system of claim 8, wherein the system comprises a mobile phone.

24. The system of claim 8, wherein the system comprises an automotive light detection and ranging (LIDAR) system.

25. A method comprising:
at a first time,
selecting a first camera of a dual camera system having the first camera and a second camera, the first camera having a first camera field of view (FoV) and the second camera having a second camera FoV,
projecting a first light from a first illumination source through a first transmitter (TX) lens,
electrically configuring a time of flight (ToF) imaging array to have a first FoV equivalent to the first camera FoV by selecting a first group of photodetectors of the ToF imaging array,
capturing the first light with the ToF imaging array after the first light reflects from objects in the first FoV, and
transmitting ToF data associated with the captured first light with a plurality of ToF channels coupled to photodetectors of the ToF imaging array; and
at a second time,
selecting the second camera,
projecting a second light from a second illumination source through a second TX lens,
electrically configuring the ToF imaging array to have a second FoV equivalent to the second camera FoV by selecting a second group of photodetectors of the ToF imaging array and turning off a third group of photodetectors of the ToF imaging array, wherein the first group of photodetectors comprises the third group of photodetectors,
capturing the second light with the ToF imaging array after the second light reflects from objects in the second FoV, and
transmitting ToF data associated with the captured second light with the plurality of ToF channels.

26. The method of claim 25, wherein the first camera FoV is wider than the second camera FoV, and wherein the second FoV has more energy at a center of the second FoV than at edges of the second FoV.

27. The method of claim 25, wherein the first FoV has more energy at edges of the first FoV than at a center of the first FoV, and wherein the second camera FoV is narrower than the first camera FoV.

28. The method of claim 27, further comprising, at the second time:
projecting the first light from the first illumination source through a first TX lens; and
capturing the first light with the ToF imaging array after the first light reflects from objects in the first FoV, wherein the transmitted ToF data corresponds to a third FoV having uniform distribution of energy.

29. The method of claim 25, wherein projecting the first light from the first illumination source through the first TX lens comprises turning on a first vertical-cavity surface-emitting laser (VCSEL).

30. The method of claim 25, further comprising:
receiving, with an autofocus (AF) module, ToF data captured with the ToF imaging array; and
adjust a lens of the dual camera system with the AF module based on the ToF data received by the AF module.

31. The method of claim 25, wherein transmitting ToF data associated with the captured first light comprises using a first group of ToF channels, and wherein transmitting ToF data associated with the captured second light comprises using a second group of ToF channels different than the first group of ToF channels.

32. A mobile phone comprising:
a dual camera module having a first camera and a second camera, wherein the first camera has a first field of view (FoV) and the second camera has a second FoV;
a dual illumination source having a first light source and a second light source;
a dual transmitter (TX) lens located between the dual illumination source and a scene, the dual TX lens comprising a first TX lens and a second TX lens, wherein the first light source is configured to project light through the first TX lens, and the second light source is configured to project light through the second TX lens;
a time of flight (ToF) imaging array configured to measure distances to objects in the scene, the ToF imaging array comprising
a plurality of photodetectors,
a plurality of ToF channels coupled to the plurality of photodetectors, wherein:
in a first mode, the ToF imaging array is configured to select a first group of photodetectors from the plurality of photodetectors, the first group of photodetectors corresponding to the first FoV, and measure distances to objects in the scene corresponding to the first FoV, and the plurality of ToF channels are configured to transmit ToF data corresponding to the first FoV, and
in a second mode, the ToF imaging array is configured to select a second group of photodetectors from the plurality of photodetectors, the second group of photodetectors being different than the first group of photodetectors and corresponding to the second FoV different than the first FoV, and measure distances to objects in the scene corresponding to the second FoV, wherein the ToF imaging array is configured to turn off a third group of unselected photodetectors of the plurality of photodetectors before the ToF imaging array measures distances to objects in the scene corresponding to the second FoV, and wherein the plurality of ToF channels are configured to transmit ToF data corresponding to the second FoV;
a received (RX) lens located between the scene and the ToF imaging array; and
an autofocus (AF) module configured to receive ToF data from the ToF channels and to focus the dual camera module on objects of the scene based on the received ToF data.

33. The mobile phone of claim 32, wherein the dual camera module and the ToF imaging array are located in a back cover of the mobile phone.

34. The mobile phone of claim 33, further comprising:
a second dual camera module located in a front cover of the mobile phone; and
a second ToF imaging array located in the front cover of the mobile phone.

* * * * *